(12) United States Patent
Ito

(10) Patent No.: US 10,854,122 B2
(45) Date of Patent: Dec. 1, 2020

(54) SEMICONDUCTOR DEVICE, DISPLAY DRIVER AND DISPLAY DEVICE

(71) Applicant: Rohm Co., Ltd., Kyoto (JP)

(72) Inventor: Sukenori Ito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/681,338

(22) Filed: Nov. 12, 2019

(65) Prior Publication Data

US 2020/0160766 A1    May 21, 2020

(30) Foreign Application Priority Data

Nov. 16, 2018 (JP) ................................ 2018-215325

(51) Int. Cl.
*G09G 5/00* (2006.01)
*G09G 3/00* (2006.01)
(Continued)

(52) U.S. Cl.
CPC .............. *G09G 3/006* (2013.01); *G09G 3/36* (2013.01); *H01L 24/13* (2013.01); *H01L 24/16* (2013.01);
(Continued)

(58) Field of Classification Search
CPC .. G09G 3/006; G09G 3/36; G09G 2300/0408; G09G 2320/043;
(Continued)

(56) References Cited

U.S. PATENT DOCUMENTS 6,132,646 A * 10/2000 Zhou .................... B23K 35/025
148/24
6,458,624 B1 * 10/2002 Jiang ......................... C09J 9/02
257/783
(Continued)

FOREIGN PATENT DOCUMENTS

JP         2011-013389         1/2011

*Primary Examiner* — Joe H Cheng
(74) *Attorney, Agent, or Firm* — Fish & Richardson P.C.

(57) ABSTRACT

The present disclosure relates to evaluation of a mounted resistor formed between a bump and electrodes.
A display device of the present disclosure includes a display panel formed in a transparent substrate and a display driver driving the display panel. A plurality of bumps is formed on a connection surface of the display driver. A plurality of electrodes is formed on the transparent substrate and corresponds in position to the plurality of bumps. COG mounting enables the bumps on the display driver side to electrically connect to the electrodes on the transparent substrate side. On the connection surface of the display driver, the bumps, which are for use in signal transmission, further include a first evaluation-oriented bump (TA[i]) and a second evaluation-oriented bump (TB[i]). Evaluation-oriented electrodes (EL[i]) are disposed on the transparent substrate and correspond in position to the first evaluation-oriented bump (TA[i]) and the second evaluation-oriented bump (TB[i]). Upon completion of COG mounting, a resistance value evaluation circuit (140a) disposed on the display driver generates evaluation signal (DET[i]) corresponding to resistance value (RA[i]+RB[i]) between the evaluation-oriented electrodes and the first and second evaluation-oriented bumps.

13 Claims, 15 Drawing Sheets

(51) Int. Cl.
*H01L 23/00* (2006.01)
*G09G 3/36* (2006.01)

(52) U.S. Cl.
CPC ... *G09G 2320/043* (2013.01); *G09G 2330/12* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01)

(58) Field of Classification Search
CPC ..... G09G 2330/12; H01L 24/13; H01L 24/16; H01L 24/73; H01L 2224/16225; H01L 2224/16227; H01L 2224/16238; H01L 2224/32225; H01L 2224/73204
See application file for complete search history.

(56) References Cited

U.S. PATENT DOCUMENTS

| | | | | |
|---|---|---|---|---|
| 2002/0050643 | A1* | 5/2002 | Takezawa | H01B 1/22 257/746 |
| 2003/0209815 | A1* | 11/2003 | Ito | H01L 23/544 257/797 |
| 2007/0290302 | A1* | 12/2007 | Nakagawa | H01L 23/49833 257/668 |
| 2010/0025681 | A1* | 2/2010 | Katoh | H01L 24/81 257/48 |
| 2012/0217609 | A1* | 8/2012 | Tanabe | G01P 15/18 257/470 |
| 2015/0014842 | A1* | 1/2015 | Honda | H01L 24/73 257/734 |

\* cited by examiner

SEMICONDUCTOR DEVICE, DISPLAY DRIVER AND DISPLAY DEVICE

BACKGROUND OF THE INVENTION

Field of the Invention

The present disclosure relates to a semiconductor device, a display driver and a display device.

Description of the Prior Art

In a display device with a display panel formed in a transparent substrate, a display driver is often implemented as an IC (integrated circuit) chip also known as a bare die. Under this condition, a plurality of bumps is formed on a connection surface of the display driver, whereas a plurality of electrodes is formed on a mounting surface of the transparent substrate and corresponds in position to the plurality of bumps. After the connection surface of the display driver and the mounting surface of the transparent substrate have been positioned opposite to each other and aligned at a specific position, anisotropic conductive films are inserted between the transparent substrate and the display driver and adhered together, thereby allowing the bumps on the display driver side to electrically connect to the electrodes on the transparent substrate side.

The aforesaid mounting technology is commonly known as COG (Chip-On-Glass). A contact resistor formed between each bump and electrodes is known as a mounted resistor.

PRIOR ART DOCUMENT

Citation Document

[Citation Document 1] Japan published patent application 2011-13389.

SUMMARY OF THE INVENTION

Problem to be Solved by Present Disclosure

The resistance value of a mounted resistor is expected to be, for example, less than 3Ω or less than 30Ω, but the resistance value of the mounted resistor is likely to be too high because of poor connection during a COG mounting process. Furthermore, odds are the resistance value of the mounted resistor increases as a result of years of deterioration. An overly high resistance value of the mounted resistor hinders signal transmission between the display driver and the transparent substrate, and in consequence proper display is unlikely. In view of this, evaluation of a mounted resistor brings advantages, for example, performing a warning procedure in accordance with its result.

Furthermore, effects of the display device, transparent substrate and COG mounting on the mounted resistor are described hereunder. However, the effects are not restricted to the display device, transparent substrate and COG mounting and thus may also exist in the other places.

The objective of the present disclosure is to provide a semiconductor device conducive to evaluation of a mounted resistor, a display driver using the semiconductor device, and a display device.

Technical Means to Solve Problem

The semiconductor device of the present disclosure has a connection surface which a signal-oriented bump group is formed on and allows signals to be sent to an object substrate through a signal-oriented electrode group on the object substrate and the signal-oriented bump group and the object substrate disposed opposite to the connection surface. The semiconductor device of the present disclosure comprises: a pair of evaluation-oriented bumps comprising a first evaluation-oriented bump and a second evaluation-oriented bump which are disposed on the connection surface differently from the signal-oriented bump group and spaced apart from each other; and a resistance value evaluation circuit, wherein an evaluation-oriented electrode on the object substrate is in contact with the pair of evaluation-oriented bumps in a standard state where the object substrate is disposed opposite to the connection surface and the signal-oriented electrode group electrically connects to the signal-oriented bump group, wherein the resistance value evaluation circuit generates an evaluation signal corresponding to a resistance value between the first evaluation-oriented bump and the second evaluation-oriented bump through the evaluation-oriented electrode in the standard state.

Specifically speaking, for example, regarding the semiconductor device, in the standard state, the resistance value evaluation circuit generates the evaluation signal in accordance with the sum of a resistance value generated by a first mounted resistor between the first evaluation-oriented bump and the evaluation-oriented electrodes and a resistance value generated by a second mounted resistor between the second evaluation-oriented bump and the evaluation-oriented electrodes.

Specifically speaking, for example, regarding the semiconductor device, the resistance value evaluation circuit generates the evaluation signal having a first logical value when the sum of the resistance values is relatively low and generates the evaluation signal having a second logical value when the sum of the resistance values is relatively high.

Specifically speaking, for example, after generating the evaluation signal having the second logical value, the semiconductor device sends a specific error signal outward.

For example, regarding the semiconductor device, the resistance value evaluation circuit generates the evaluation signal in accordance with a voltage generated between the first evaluation-oriented bump and the second evaluation-oriented bump when a specific DC voltage is applied to a series-connected circuit of the first evaluation-oriented bumps, second evaluation-oriented bumps and at least one evaluation-oriented resistor which are connected by the evaluation-oriented electrodes.

For example, regarding the semiconductor device, the resistance value evaluation circuit comprises a first evaluation-oriented resistor with an end connected to the first evaluation-oriented bump and a second evaluation-oriented resistor with an end connected to the second evaluation-oriented bump, and the resistance value evaluation circuit generates the evaluation signal in accordance with a voltage generated between the first evaluation-oriented bump and the second evaluation-oriented bump when the DC voltage is applied to between another end of the first evaluation-oriented resistor and another end of the second evaluation-oriented resistor.

For example, regarding the semiconductor device, the resistance value evaluation circuit generates the evaluation signal according to a current flowing between the first evaluation-oriented bump and the second evaluation-oriented bump when a voltage is applied to between the first evaluation-oriented bump and the second evaluation-oriented bump.

For example, regarding the semiconductor device, a plurality of pairs of evaluation-oriented bumps are provided as the pair of evaluation-oriented bumps, in the standard state, the evaluation-oriented electrodes on the object substrate are in contact with the pairs of evaluation-oriented bumps, respectively, and the resistance value evaluation circuit generates the evaluation signal to each group of the evaluation-oriented electrodes and the pair of evaluation-oriented bumps which contact to each other in the standard state.

For example, regarding the semiconductor device, a plurality of resistance value evaluation circuits is provided as the resistance value evaluation circuit, one resistance value evaluation circuit is assigned to each pair of evaluation-oriented bumps, and the resistance value evaluation circuits each generate the evaluation signal related to the corresponding pair of evaluation-oriented bumps.

For example, regarding the semiconductor device, the plurality of pairs of evaluation-oriented bumps comprises a first pair of evaluation-oriented bumps and a second pair of evaluation-oriented bumps, and at least one signal-oriented bump which forms the signal-oriented bump group is disposed on the connection surface and between the first pair of evaluation-oriented bumps and the second pair of evaluation-oriented bumps.

For example, the plurality of pairs of evaluation-oriented bumps comprises a first pair of evaluation-oriented bumps to a fourth pair of evaluation-oriented bumps which are disposed at a first position to a fourth position on the connection surface, and at least one signal-oriented bump which forms the signal-oriented bump group is disposed on the connection surface and positioned on or within a rectangle formed by connecting the first position to the fourth position.

A display driver of the present disclosure drives a display panel formed in a transparent substrate and uses the semiconductor device. The display driver of the present disclosure is characterized in that: the object substrate is the transparent substrate, and the display driver sends signals for specifying display contents in the display panel through the signal-oriented bump group and the signal-oriented electrode group on the transparent substrate in the standard state.

The display driver of the present disclosure comprises the display driver and the transparent substrate which the display panel is formed.

Effect of Invention

The present disclosure provides a semiconductor device conducive to evaluation of a mounted resistor, a display driver using the semiconductor device, and a display device.

DETAILED DESCRIPTION OF THE EMBODIMENTS

Embodiments of the present disclosure are hereunder described with reference made to the accompanying diagrams. In the accompanying diagrams, identical elements are denoted by identical signs, and thus description of shared features is basically omitted. Moreover, for the sake of brevity, notations or signs indicative of information, signals, physical quantity, elements or members are hereunder used to dispense with or abridge the names of the information, signals, physical quantity, elements or members which the notations or signs are indicative of. For example, with "CHK[0]" being indicative of a pair of evaluation-oriented bumps, both the expression "a pair of evaluation-oriented bumps CHK[0]" and the abridged expression "bump pair CHK[0]" are acceptable and refer to exactly the same element.

First, some terms used in this embodiment are explained below. The term "level" means electric potential level; any signal or voltage has higher electric potential when at a high level than at a low level. The terms "line" and "wiring" carry the same meaning. Regarding any transistor implemented as FET (field-effect transistor), the term "ON state" means that the drain and source of the transistor are electrically connected, whereas the term "OFF state" means that the drain and source of the transistor are not electrically connected. Sometimes the terms "ON state" and "OFF state" merely mean "electrically connected" and "not electrically connected", respectively.

First Embodiment

Figure 1:
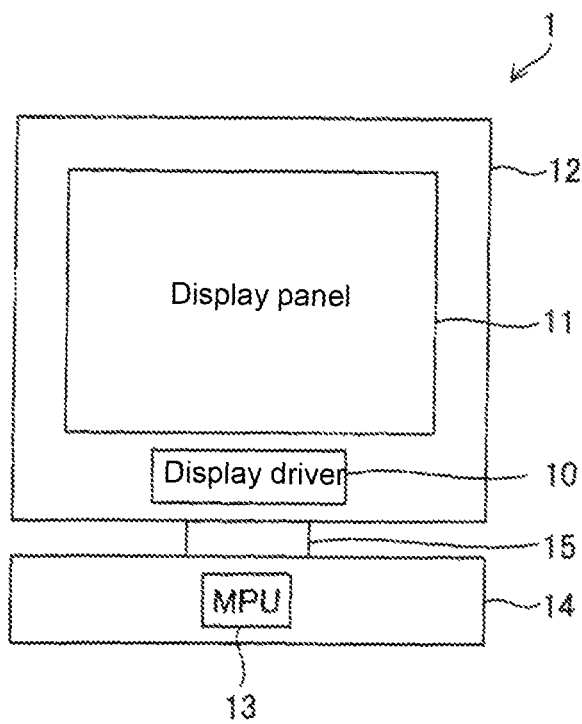
FIG. 1 is a block diagram of a display device according to the first embodiment of the present disclosure.

The first embodiment of the present disclosure is described below. FIG. 1 is a block diagram of a display device 1 according to the first embodiment of the present disclosure. The display device 1 comprises a display driver 10, display panel 11, transparent substrate 12, MPU (micro processing unit)13, printed substrate 14, and connection component 15.

The transparent substrate 12 is, for example, a glass substrate. The display panel 11 is formed in the transparent substrate 12 and displays images corresponding to signals from the display driver 10. Furthermore, the display device 1 is a liquid crystal display device. Under this condition, the display panel 11 is a liquid crystal panel.

The display driver 10 is a semiconductor device which includes a semiconductor IC mounted on the transparent substrate 12. The display driver 10 drives the display panel 11 by providing required signals to the display panel 11. The display panel 11 is driven in any mode, for example, either passive mode or active mode.

The MPU13 is mounted on the printed substrate 14. In addition to the MPU13, any other circuits (such as a power circuit) can be mounted on the printed substrate 14; however, FIG. 1 shows the MPU13 only. The connection component 15 connects the printed substrate 14 and the transparent substrate 12 and is, for example, implemented as a flexible substrate. The connection component 15 enables bidirectional communication between the MPU13 and the display driver 10. Furthermore, a power voltage, which is supplied to the transparent substrate 12 and includes a driving voltage of the display driver 10, is supplied from the printed substrate 14 to the transparent substrate 12 via the connection component 15.

In the display device 1, image data is provided from the MPU13 to the display driver 10 via the connection component 15, and the display driver 10 provides an image signal corresponding to the image data to the display panel 11, thereby allowing the display panel 11 to display images. The image data is display contents dedicated to the display panel 11. Since an image signal corresponding to the image data is provided to the display panel 11, the image signal is a signal of the display contents dedicated to the display panel 11 (hence, a display image of the display panel 11).

Figure 2:
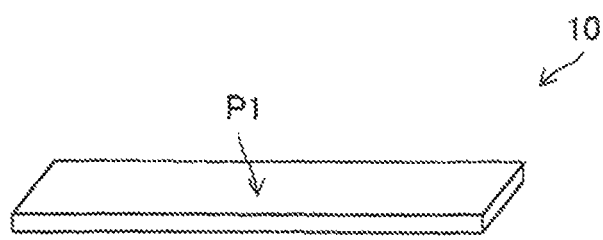
FIG. 2 is a perspective view of a display driver according to the first embodiment of the present disclosure.
Figure 3:
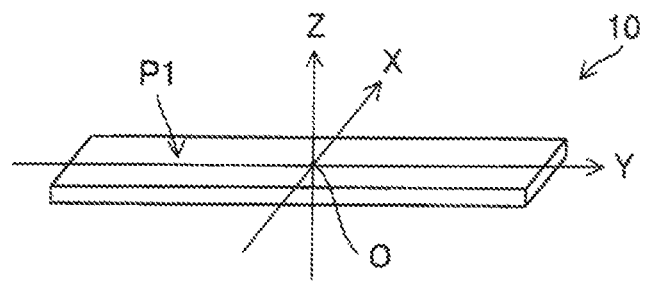
FIG. 3 is a perspective view of the display driver and its relationship with X axis, Y axis and Z axis according to the first embodiment of the present disclosure.

The display driver 10 is implemented as an IC chip mounted on the transparent substrate 12 by COG (Chip-On-Glass) mounting. As shown in FIG. 2, the display driver 10 is in a rectangular shape when viewed from above. The shape of the display driver 10 is hereunder described with reference made to X axis, Y axis and Z axis perpendicular to each other at origin O, as shown in FIG. 3. Moreover, the plane parallel to X axis and Y axis is known as XY-plane. The display driver 10 is an IC chip with its thickness dimension defined along Z axis. Two surfaces of the IC chip are parallel to XY-plane, and one of the two surfaces is defined as connection surface P1. A plurality of bumps (not shown in FIG. 2 and FIG. 3) is formed on the connection surface P1. The connection surface P1 is in a rectangular shape. The center of the connection surface P1 is defined as origin O. As for the rectangular outline of the connection surface P1, its long sides are parallel to Y axis, and its short sides are parallel to X axis.

Figure 4:
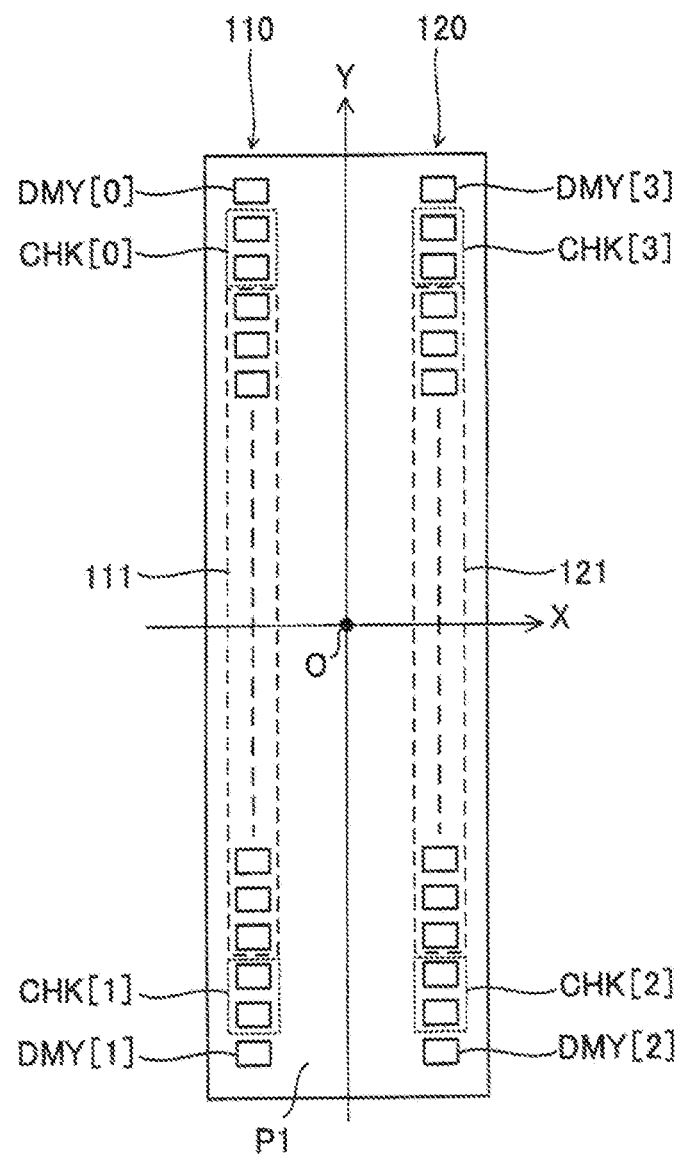
FIG. 4 is a schematic view of arrangement of bumps on a connection surface of the display driver according to the first embodiment of the present disclosure.

FIG. 4 shows arrangement of bumps formed on the connection surface P1 of the display driver 10. The bumps are elevated, gold-containing connection electrodes. Two bump rows are formed on the connection surface P1 and aligned along Y axis. One of the two bump rows is disposed on the negative side of X axis and defined as bump row 110. The other bump row is disposed on the positive side of X axis and defined as bump row 120.

A dummy bump DMY[0] is disposed at one end of the bump row 110 and on the positive side of Y axis. A dummy bump DMY[1] is disposed at the other end of the bump row 110 and on the negative side of Y axis. In the bump row 110, a pair of evaluation-oriented bumps CHK[0] is formed and positioned proximate to the dummy bump DMY[0], whereas a pair of evaluation-oriented bumps CHK[1] is formed and positioned proximate to the dummy bump DMY[1]. Furthermore, in the bump row 110, a bump block 111 including a plurality of bumps is disposed between the pair of evaluation-oriented bumps CHK[0] and the pair of evaluation-oriented bumps CHK[1]. Therefore, the bump row 110 starts from the dummy bump DMY[0] and ends at the dummy bump DMY[1], aligning the dummy bump DMY[0], pair of evaluation-oriented bumps CHK[0], bump block 111, pair of evaluation-oriented bumps CHK[1], and dummy bump DMY[1] sequentially along Y axis.

A dummy bump DMY[3] is disposed at one end of the bump row 120 and on the positive side of Y axis. A dummy bump DMY[2] is disposed at the other end of the bump row 120 and on negative side of Y axis. in the bump row 120, a pair of evaluation-oriented bumps CHK[3] is formed and positioned proximate to the dummy bump DMY[3], whereas a pair of evaluation-oriented bumps CHK[2] is formed and positioned proximate to the dummy bump DMY[2]. Furthermore, in the bump row 120, a bump block 121 including a plurality of bumps is disposed between the pair of evaluation-oriented bumps CHK[3] and the pair of evaluation-oriented bumps CHK[2]. Therefore, the bump row 120 starts from the dummy bump DMY[3] and ends at the dummy bump DMY[2], aligning the dummy bump DMY[3], pair of evaluation-oriented bumps CHK[3], bump block 121, pair of evaluation-oriented bumps CHK[2], and dummy bump DMY[2] sequentially along Y axis.

The bump pair CHK[0] and the bump pair CHK[1] are symmetric to each other with respect to X axis. The bump pair CHK[2] and the bump pair CHK[3] are symmetric to each other with respect to X axis. The bump pair CHK[0] and the bump pair CHK[3] are symmetric to each other with respect to Y axis. The bump pair CHK[1] and the bump pair CHK[2] are symmetric to each other with respect to Y axis. Therefore, the bump pair CHK[0] and the bump pair CHK[2] are symmetric to each other with respect to origin O, whereas the bump pair CHK[1] and the bump pair CHK[3] are symmetric to each other with respect to origin O.

Figure 5:
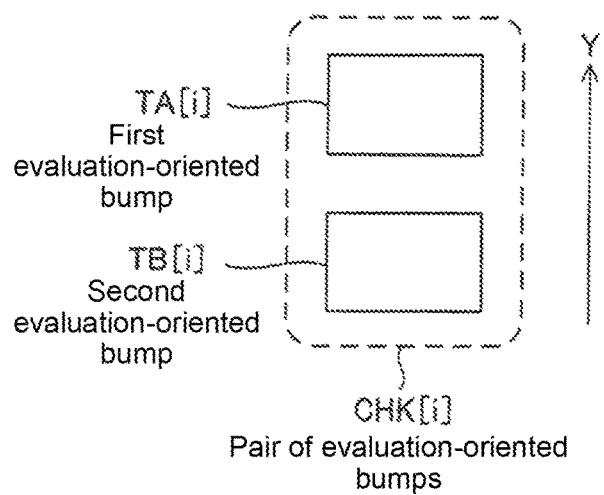
FIG. 5 is a block diagram of one pair of evaluation-oriented bumps according to the first embodiment of the present disclosure.

Each pair of evaluation-oriented bumps CHK[0]~CHK[3] is a pair of evaluation-oriented bumps, including a first evaluation-oriented bump and a second evaluation-oriented bump. Each pair of evaluation-oriented bumps CHK[0] ~CHK[3] includes identical bumps. Each pair of evaluation-oriented bumps CHK[0]~CHK[3] is denoted by "CHK[i]", where i represents an integer. As shown in FIG. 5, the first evaluation-oriented bump and the second evaluation-oriented bump which form each pair of evaluation-oriented bumps CHK[i] are denoted by "TA[i]", "TB[i]", respectively. In each pair of evaluation-oriented bumps CHK[i], the first evaluation-oriented bump TA[i] and the second evaluation-oriented bump TB[i] are spaced apart from each other along Y axis. Prior to the COG mounting described below, the bumps TA[i] and TB[i] are insulated from each other.

The plurality of bumps implemented as the bump blocks 111 and 121 includes at least one signal-oriented bump for transmitting the image signal, includes power-oriented bumps for receiving a driving voltage of the display driver 10, and includes communication-oriented bumps for attaining bidirectional communication between the display driver 10 and the MPU13.

Figure 6:
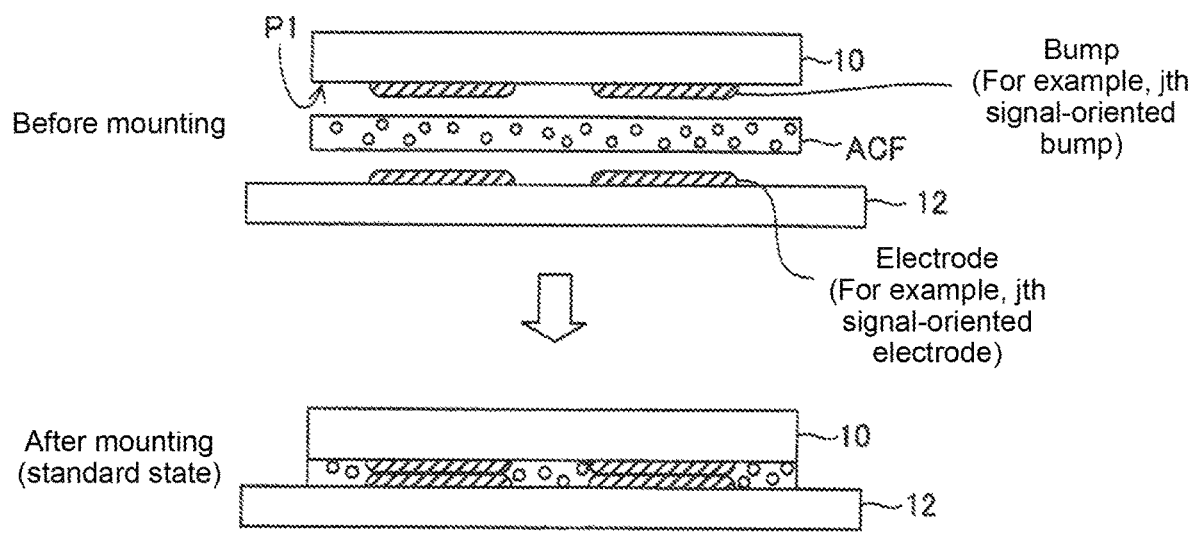
FIG. 6 is a schematic view of connecting bumps to electrodes by COG mounting according to the first embodiment of the present disclosure.

The display driver 10 is an IC (integrated circuit) chip also known as a bare die, which undergoes COG mounting relative to the transparent substrate 12. FIG. 6 shows how COG mounting is carried out. The plurality of electrodes are disposed on the transparent substrate 12 and electrically connected to the bumps formed on the connection surface P1 of the display driver 10, respectively. The electrodes disposed on the transparent substrate 12 may also be transparent electrodes made of ITO (indium-tin-oxide). Furthermore, for the sake of illustration, considerations are given to a signal-oriented bump group which comprises signal-oriented bumps, namely a first signal-oriented bump~a 200th signal-oriented bump, and is formed on the display driver 10. Under this condition, a signal-oriented electrode group is formed on the mounting surface of the transparent substrate 12. The signal-oriented electrode group comprises a first signal-oriented electrode~a 200th signal-oriented electrode which electrically connect to the first signal-oriented bump~the 200th signal-oriented bump, respectively.

After the connection surface P1 of the display driver 10 and the mounting surface of the transparent substrate 12 have been positioned opposite to each other and aligned at a specific position, anisotropic conductive films (hereinafter referred to as ACF) are inserted between the mounting surface of the transparent substrate 12 and the connection surface P1 of the display driver 10 and adhered together. The ACF are an insulative adhesive film around 30 μm thick, and conductive microparticles are distributed across the adhesive film. The ACF are inserted between an IC chip functioning as the display driver 10 and the transparent substrate 12; then, they are heated and laminated together. Hence, the conductive microparticles are inserted between each bump and the corresponding electrode to attain electrical connection therebetween (but, for the sake of conciseness of the diagram, FIG. 6 does not show the inserted conductive microparticles; this is also the case in FIG. 8.)

For the sake of convenience, the state after the subsequent COG mounting is hereinafter referred to as the standard state. For example, the display panel 11 comprises first~200th pixels. A jth image signal is transmitted from the display driver 10 to the display panel 11 via the jth signal-oriented bump and the jth signal-oriented electrode, and display contents of the jth pixel are controlled in accordance with the jth image signal (where j is an integer). In the standard state, the first signal-oriented bump~the 200th signal-oriented bump electrically connect to the first signal-oriented electrode~the 200th signal-oriented electrode, respectively.

A mounted resistor is defined as a contact resistor formed between each bump and electrodes when the bump is connected to the electrodes by COG mounting. The resistance value of a mounted resistor is expected to be, for example, less than 3Ω or less than 30Ω, but the resistance value of the mounted resistor is likely to be too high because of poor connection during a COG mounting process. Furthermore, odds are the resistance value of the mounted resistor increases as a result of years of deterioration. An overly high resistance value of the mounted resistor formed between the signal-oriented bumps and the signal-oriented electrodes hinders signal transmission.

Figure 7:
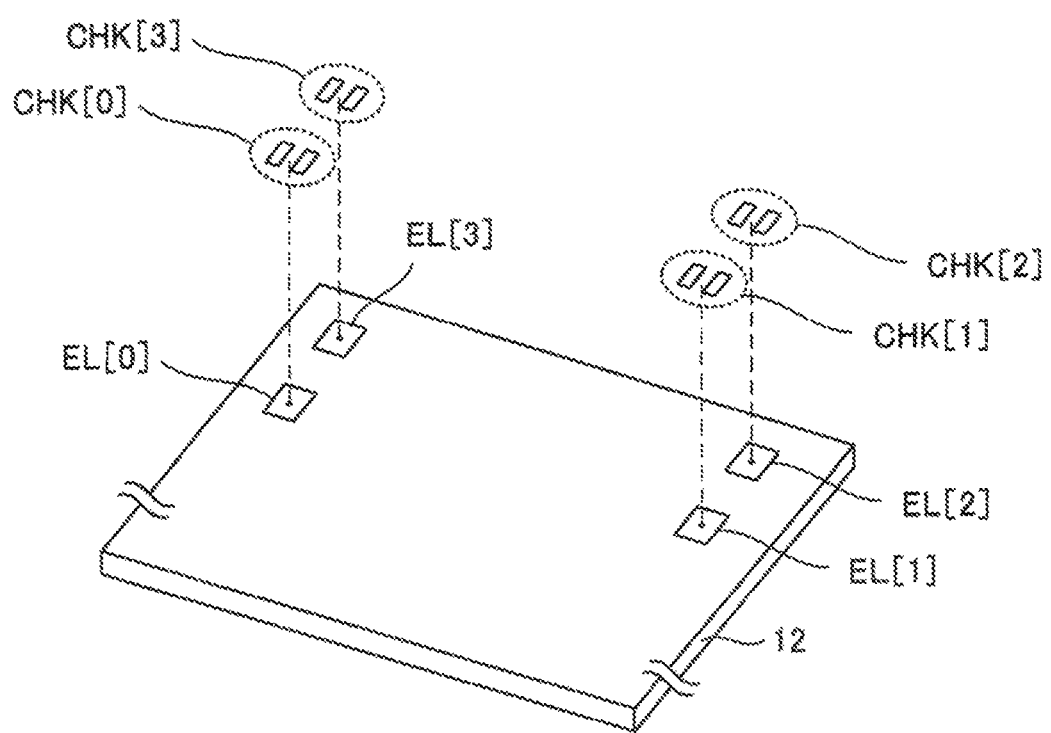
FIG. 7 is a schematic view of evaluation-oriented electrodes disposed on a transparent substrate and corresponding in position to each pair of evaluation-oriented bumps according to the first embodiment of the present disclosure.

Therefore, the display device 1 is capable of evaluating the mounted resistor formed between the display driver 10 and the transparent substrate 12. To this end, as shown in FIG. 7, evaluation-oriented electrodes are disposed on the mounting surface of the transparent substrate 12 and disposed opposite to each pair of evaluation-oriented bumps. The evaluation-oriented electrodes disposed opposite to each pair of evaluation-oriented bumps CHK[i] are denoted by "EL[i]". Therefore, evaluation-oriented electrodes EL[0]~EL[3] are disposed at four points on the mounting surface of the transparent substrate 12 and disposed opposite to each pair of evaluation-oriented bumps CHK[0]~CHK[3]. FIG. 7 schematically shows the relationship between a pair of evaluation-oriented bumps CHK[0]~CHK[3] and the evaluation-oriented electrodes EL[0]~EL[3].

Figure 8:
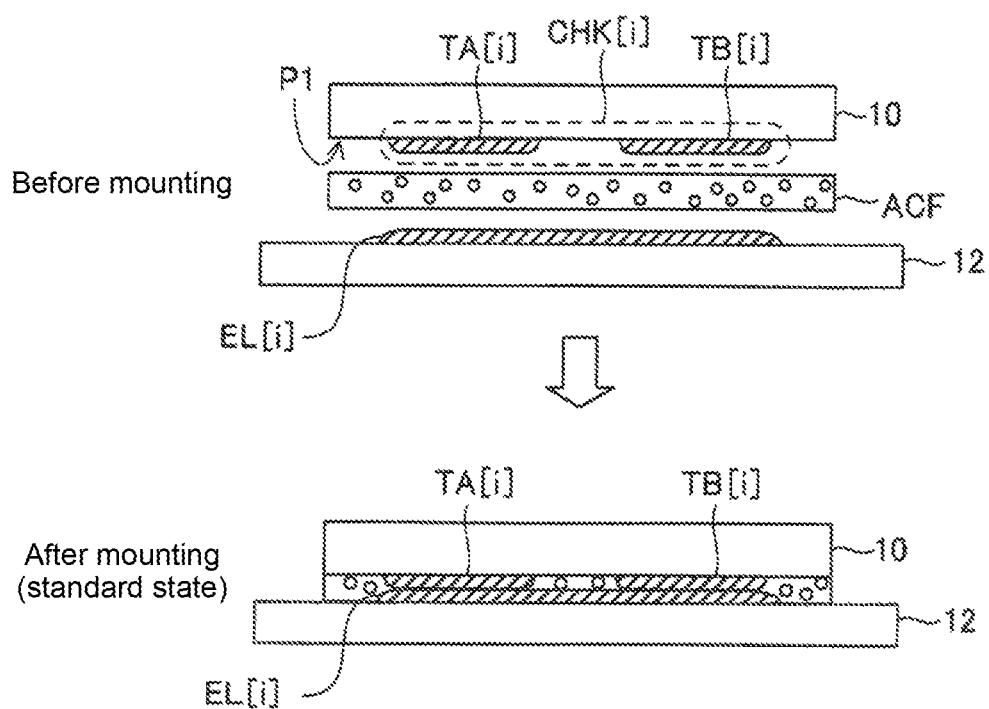
FIG. 8 is a schematic view of connecting the evaluation-oriented bumps to the evaluation-oriented electrodes by COG mounting according to the first embodiment of the present disclosure.

FIG. 8 shows that one pair of evaluation-oriented bumps CHK[i] are in contact with and electrically connect to the evaluation-oriented electrodes EL[i] by COG mounting, respectively. As with the case between the signal-oriented bumps and signal-oriented electrodes, each pair of evaluation-oriented bumps CHK[i] and the evaluation-oriented electrodes EL[i] are connected by COG mounting, albeit in the presence of the intervening ACF therebetween. In the standard state, each pair of evaluation-oriented bumps CHK[i] are in contact with and electrically connect to the evaluation-oriented electrodes EL[i], respectively. Furthermore, on XY-plane, the evaluation-oriented electrodes EL[i] are larger than the evaluation-oriented bumps TA[i] and TB[i] collectively. In standard state, the evaluation-oriented bumps TA[i] and TB[i] are in contact with and electrically connect to the evaluation-oriented electrodes EL[i], respectively.

Moreover, the evaluation-oriented electrodes EL[i] in contact with each pair of evaluation-oriented bumps CHK[i] include a plurality of electrodes. Therefore, for example, first electrodes are disposed on the mounting surface of the transparent substrate 12 and correspond in position to the evaluation-oriented bump TA[i]. Second electrodes are disposed on the mounting surface of the transparent substrate 12, correspond in position to the evaluation-oriented bump TB[i], and are spaced apart from the first electrodes. The first and second electrodes constitute the evaluation-oriented electrodes EL[i]. However, under this condition, the first and second electrodes are electrically connected by wirings disposed in the transparent substrate 12.

The electrodes are disposed on the transparent substrate 12 but are not disposed opposite to the dummy bumps DMY[0]~DMY[3]. In the standard state, the dummy bumps DMY[0]~DMY[3] enter an open state (i.e., not electrically connected to any circuit and wiring). Unless otherwise specified hereunder, the display driver 10 and the transparent substrate 12 are connected in the standard state.

Figure 9:
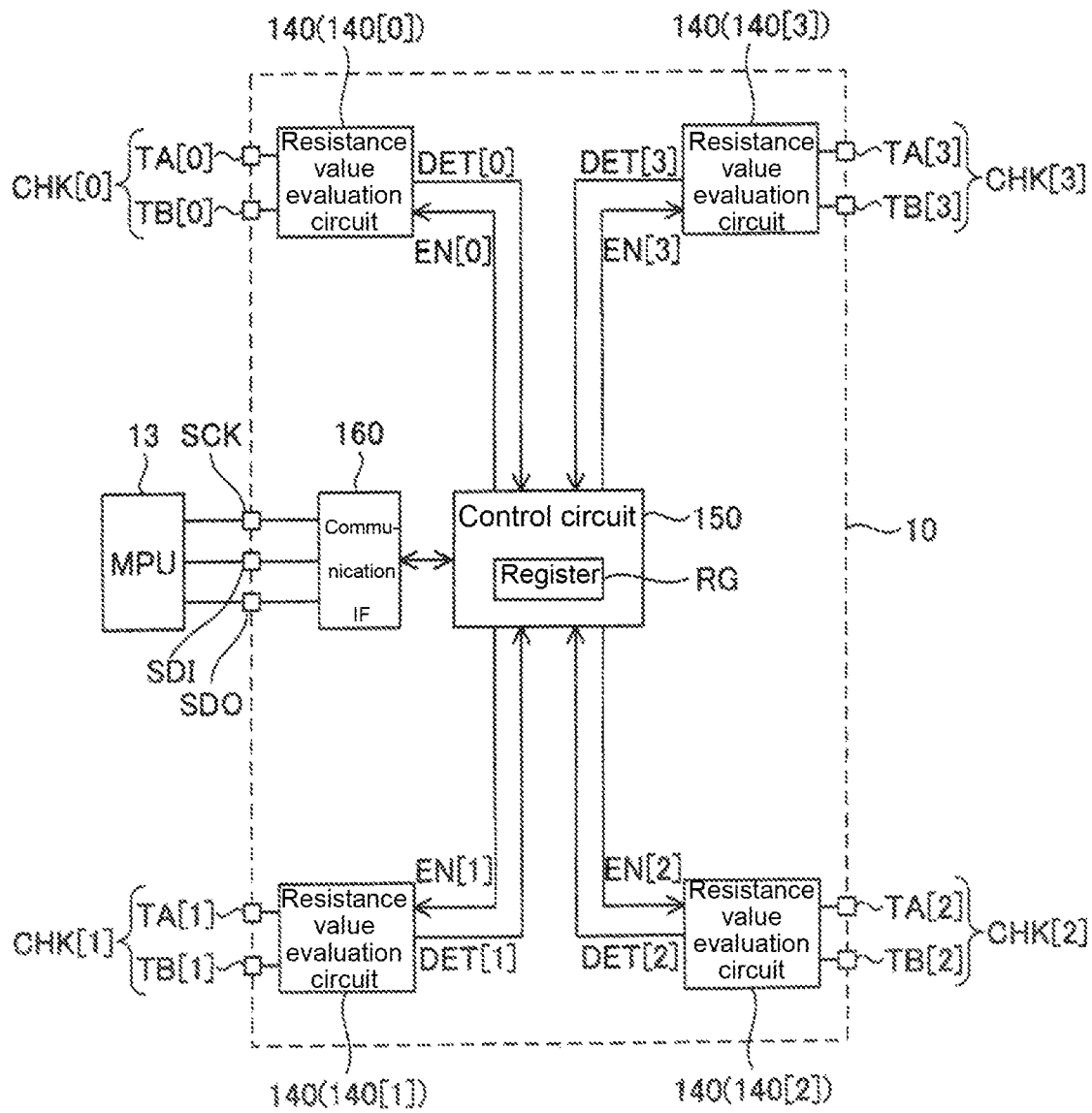
FIG. 9 is a block diagram of components related to evaluation of a mounted resistor according to the first embodiment of the present disclosure.

FIG. 9 is a block diagram of components related to evaluation of a mounted resistor and disposed in the display driver 10. The display driver 10 comprises four resistance value evaluation circuits 140 corresponding in position to the pairs of evaluation-oriented bumps, respectively, a control circuit 150 for controlling the resistance value evaluation circuits 140, and a communication-oriented IF (interface)160. A register RG for retaining various data temporarily is disposed in the control circuit 150. The resistance value evaluation circuit 140 corresponding in position to each pair of evaluation-oriented bumps CHK[i] is denoted by "140[i]". In the IC chip which functions as the display driver 10, the evaluation circuit 140 is formed right under or near the corresponding pair of evaluation-oriented bumps, so as to shorten the course of wirings.

The evaluation circuit 140[i] connects to the first evaluation-oriented bump TA[i] and the second evaluation-oriented bump TB[i], generates the evaluation signal DET[i] corresponding to the resistance value between the bumps TA[i] and TB[i] of the evaluation-oriented electrodes EL[i], and sends the evaluation signal DET[i] to the control circuit 150. However, the control circuit 150 outputs a low-level or high-level enabling signal to the evaluation circuits 140[0]~140[3] each. It is only when the evaluation circuit 140[i] receives a high-level enabling signal that the evaluation circuit 140[i] generates and outputs the evaluation signal DET[i] corresponding to the resistance value between the bumps TA[i] and TB[i]. The enabling signal relative to the evaluation circuit 140[i] is denoted by "EN[i]".

Bidirectional communication between the display driver 10 and the MPU13 occurs in whatever forms. Furthermore, communication between the display driver 10 and the MPU13 is attained by SPI (serial peripheral interface). Under the control of the control circuit 150, SPI-based bidirectional communication between the communication-oriented IF160 and the MPU13 occurs through a communication-oriented terminal. The communication-oriented terminal is implemented as a communication-oriented bump, including an external terminal SCK for receiving a clock signal, an external terminal SDI for receiving a signal from the MPU13, and an external terminal SDO for sending a signal to the MPU13. Related details are presented later. The display driver 10 sends a specific error signal to the MPU13 upon determination that the resistance value of the mounted resistor is relatively high.

The resistance value evaluation circuits 140[0]~140[3] are identical in terms of constituent components and operation. Therefore, evaluation signal DET[i] and the constituent components and operations of the resistance value evaluation circuit 140[i], i.e., one of the resistance value evaluation circuits 140[0]~140[3], are described below.

Figure 10:
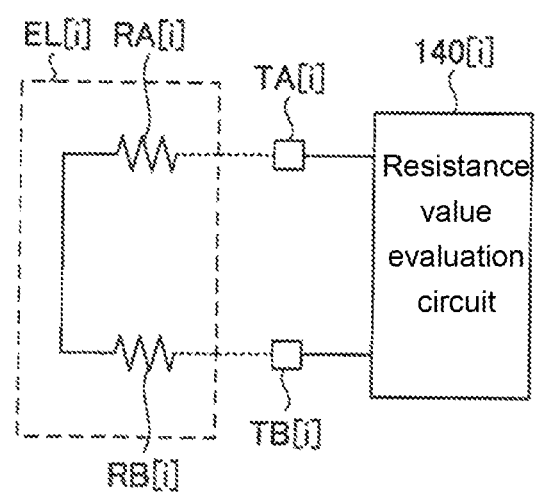
FIG. 10 is a circuit diagram which shows that a mounted resistor is formed between two evaluation-oriented bumps and the evaluation-oriented electrodes according to the first embodiment of the present disclosure.

Referring to FIG. 10, mounted resistor RA[i] is formed between evaluation-oriented bump TA[i] and evaluation-oriented electrodes EL[i], whereas mounted resistor RB[i] is formed between evaluation-oriented bump TB[i] and evaluation-oriented electrodes EL[i], when the display driver 10 performs COG mounting on the transparent substrate 12. The evaluation circuit 140[i] generates evaluation signal DET[i] corresponding to the sum (hereinafter referred to as resistance value sum $R_{SUM}[i]$) of resistance values of mounted resistors RA[i] and RB[i].

Specifically speaking, the evaluation circuit 140[i] generates evaluation signal DET[i] having the first logical value when resistance value sum $R_{SUM}[i]$ is relatively low and generates evaluation signal DET[i] having the second logical value when resistance value sum $R_{SUM}[i]$ is relatively high. Therefore, the evaluation circuit 140[i] generates the evaluation signal DET[i] having the first logical value and the evaluation signal DET[i] having the second logical value when resistance value sum $R_{SUM}[i]$ is lower than a specific threshold resistance value $R_{TH}$ and higher than a specific threshold resistance value $R_{TH}$, respectively. The evaluation signal DET[i] has the first or second logical value in the event of "$R_{SUM}[i]=R_{TH}$". The evaluation signal DET[i] thus generated is output to the control circuit 150. For example, when the resistance value of the mounted resistor formed between the signal-oriented bumps and the signal-oriented electrodes is as high as 1 kΩ approximately, resistance value RTH is determined in such manner that evaluation signal DET[i] has the second logical value.

Although the actual value of a mounted resistor formed between the signal-oriented bumps and signal-oriented electrodes is unknown, but the resistance value of the mounted resistor formed between the signal-oriented bumps and signal-oriented electrodes is relatively low when resistance value sum $R_{SUM}[i]$ is expected to be relatively low, and the resistance value of the mounted resistor formed between the signal-oriented bumps and signal-oriented electrodes is relatively high when resistance value sum $R_{SUM}[i]$ is expected to be relatively high as a result of years of deterioration. In view of this, evaluation of resistance value sum $R_{SUM}[i]$ is carried out in the display driver 10, and an error signal is sent when resistance value sum $R_{SUM}[i]$ is relatively high.

Figure 11:
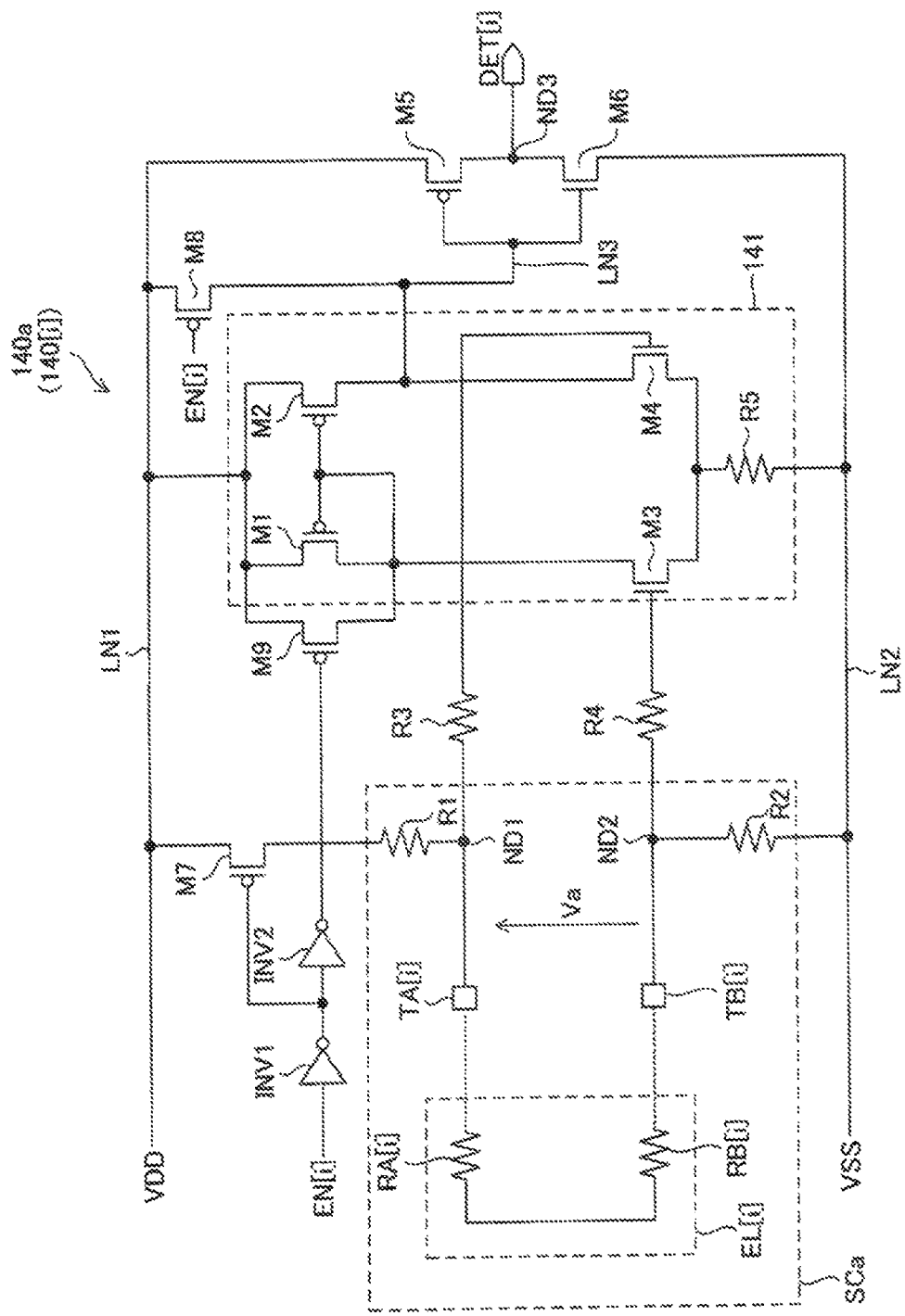
FIG. 11 is a circuit diagram of a resistance value evaluation circuit according to the first embodiment of the present disclosure.

FIG. 11 is a circuit diagram of the resistance value evaluation circuit 140a as an example of the resistance value evaluation circuit 140[i]. The evaluation circuit 140a comprises transistors M1~M9, resistors R1~R5, and inverter circuits INV1 and INV2. In the evaluation circuit 140a, positive-side power voltage VDD is applied to high-voltage side power line LN1, whereas negative-side power voltage VSS is applied to low-voltage side power line LN2. The power voltage VSS may also has an electric potential of 0 V. The specific positive DC voltage VDD is applied to power line LN1 when viewed from power line LN2. Transistors M1, M2, M5 and M7~M9 are implemented as P-channel MOSFET (metal-oxide-semiconductor field-effect transistors). Transistors M3, M4 and M6 are implemented as N-channel MOSFET. Transistors M1~M4 and resistor R5 together form a comparator 141 with recourse.

Sources of transistors M1, M2, M5 and M7~M9 are commonly connected relative to line LN1. The drain of transistor M7 connects to node ND1 by resistor R1. Node ND1 not only connects to evaluation-oriented bump TA[i] but also connects to the gate of transistor M4 by resistor R3. The gate of transistor M3 connects to node ND2 by resistor R4. Node ND2 not only connects to evaluation-oriented bump TB[i] but also connects to line LN2 by resistor R2.

The enabling signal EN[i] is input to the input end of inverter circuit INV1. The output end of inverter circuit INV1 commonly connects to the input end of inverter circuit INV2 and the gate of transistor M7. The output end of inverter circuit INV2 connects to the gate of transistor M9. The drain and gate of transistor M1, the gate of transistor M2, the drain of transistor M9, and the drain of transistor M3 connect to each other. The drains of transistors M2, M4 and M8 and the gates of transistors M5 and M6 connect to each other by line LN3. The source of transistor M6 connects to line LN2. The sources of transistors M3 and M4 connect to each other and connect to line LN2 by resistor R5. The drains of transistors M5 and M6 are commonly connected by node ND3.

In the evaluation circuit 140a shown in FIG. 11, transistor M7 is on when the enabling signal EN[i] is high-level, and thus the DC voltage VDD is applied to a series-connected circuit SCa of resistor R1 (first evaluation-oriented resistor), the mounted resistor RA[i] formed between the evaluation-oriented bump TA[i] and evaluation-oriented electrodes EL[i], the mounted resistor RB[i] formed between the evaluation-oriented bump TB[i] and evaluation-oriented electrodes EL[i], and resistor R2 (second evaluation-oriented resistor). Transistor M7 is off when the enabling signal EN[i] is low-level, and thus the DC voltage VDD is not applied to the series-connected circuit SCa. Therefore, voltage Va corresponding to resistance value sum $R_{SUM}[i]$ is generated between nodes ND1 and ND2 only within the specific evaluation interval where the enabling signal EN[i] is at a high level. Therefore, resistance value sum $R_{SUM}[i]$ can be evaluated within the evaluation interval. In this regard, voltage Va denotes the electric potential of node ND1 when viewed from the electric potential of node ND2.

Furthermore, evaluation signal DET[i] (i.e., evaluation signal DET[i] corresponding to resistance value sum $R_{SUM}[i]$) of significance appears at node ND3 only when transistors M8 and M9 are off in the event of high-level enabling signal EN[i].

Within the evaluation interval of the comparator 141 with recourse and in the presence of the high-level enabling signal EN[i], transistors M5, M6 enter ON state and OFF state, respectively, as soon as signal level of line LN3 turns low when voltage Va is higher than a specific threshold voltage $V_{TH}$, thereby allowing evaluation signal DET[i] to be at a high level.

Within the evaluation interval of the comparator 141 with recourse and in the presence of the high-level enabling signal EN[i], transistors M5, M6 enter OFF state and ON state, respectively, as soon as signal level of line LN3 turns high when voltage Va is lower than a specific threshold voltage $V_{TH}$, thereby allowing evaluation signal DET[i] to be at a low level.

In the event of "Va=$V_{TH}$", evaluation signal DET[i] is either at a high level or at a low level.

The evaluation of resistance value of resistors R1, R2 and voltage $V_{TH}$ is performed under the conditions as follows: evaluation signal DET[i] is at a high level within the evaluation interval when resistance value sum $R_{SUM}[i]$ is higher than a specific threshold resistance value $R_{TH}$, and evaluation signal DET[i] is at a low level within the evaluation interval when resistance value sum $R_{SUM}[i]$ is lower than a specific threshold resistance value $R_{TH}$. Furthermore, as for evaluation signal DET[i], a low level is equivalent to the first logical value, whereas a high level is equivalent to the second logical value (this also applies to the second embodiment to be described later). Moreover, wirings for use in transmission of evaluation signal DET[i] are pulled downward beforehand (this also applies to the second embodiment to be described later) under the conditions as follows: the enabling signal EN[i] is at a low level (i.e., outside the evaluation interval), and evaluation signal DET[i] is actually at a low level.

Figure 12:
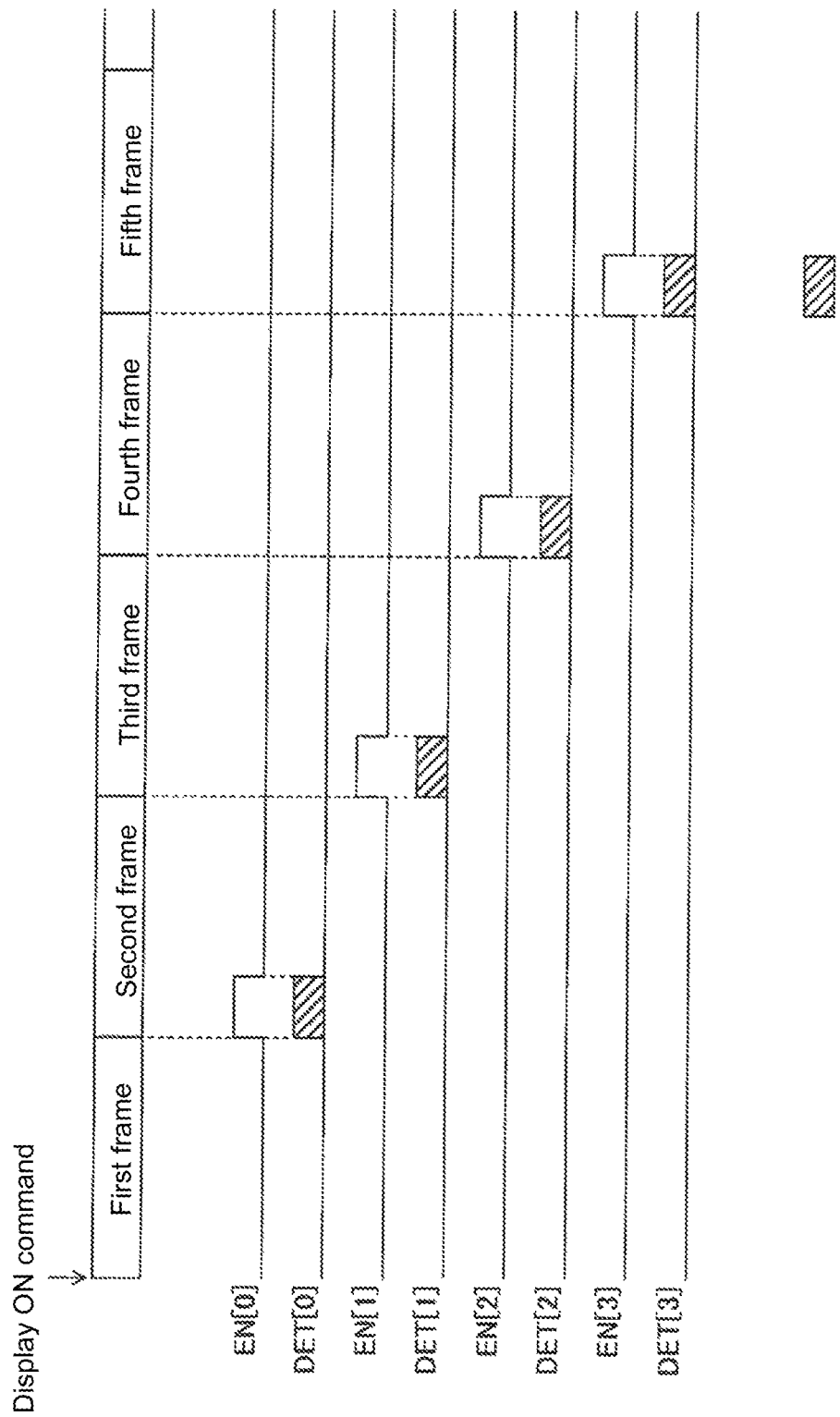
FIG. 12 is a schematic view of time sequence of evaluation of a mounted resistor according to the first embodiment of the present disclosure.

Referring to FIG. 12, the time sequence of evaluation of a mounted resistor in the resistance value evaluation circuits 140[0]~140[3] is explained below. The display driver 10 comprises a data memory (not shown) for storing image data provided by the MPU13. Upon the receipt of a specific display ON command from the MPU13, images are displayed, in the form of frame units, on the display panel 11 in accordance with the image data stored in the data memory. In the display driver 10, a frame interval is defined as lasting a specific frame period. The frame interval is generated by repeating the frame period. The frame interval generated immediately after the receipt of the display ON command is defined as the first frame interval, followed by the second, third, fourth, fifth frame intervals, and so on.

The control circuit 150, basically, keeps enabling signals EN[0]~EN[3] at a low level but permits enabling signals EN[0], EN[1], EN[2], EN[3] to be at a high level within part of the second frame interval, part of the third frame interval, part of the fourth frame interval, and part of the fifth frame interval, respectively. The part of the second frame interval, in which the enabling signal EN[0] is at a high level, corresponds to the evaluation interval for the evaluation circuit 140[0]. The part of the third frame interval, in which the enabling signal EN[1] is at a high level, corresponds to the evaluation interval for the evaluation circuit 140[1]. The part of the fourth frame interval, in which the enabling signal EN[2] is at a high level, corresponds to the evaluation interval for the evaluation circuit 140[2]. The part of the fifth frame interval, in which the enabling signal EN[3] is at a high level, corresponds to the evaluation interval for the evaluation circuit 140[3]. The part of the second frame interval, in which the enabling signal EN[0] is at a high level, starts from the starting time of the second frame interval and lasts, for example, ¹⁄₁₆ of the frame period. However, this technical feature does not limit the duration in which the enabling signal EN[0] is at a high level. This technical feature also applies to the intervals in which the enabling signals EN[1]~EN[3] are at a high level. Alternatively, the intervals in which the enabling signals EN[0]~EN[3] are at a high level are identical. Hence, for example, it is feasible that all the enabling signals EN[0]~EN[3] are simultaneously at a high level within one frame interval.

As mentioned above, evaluation signal DET[i] of significance is generated only within the evaluation interval in which the enabling signal EN[i] is at a high level. The control circuit 150 generates evaluation signals DET[0]~DET[3] of significance when the enabling signals EN[0]~EN[3] are at a high level, determines and detects whether any mounted resistor error has been generated. The control circuit 150 determines that a mounted resistor error has been generated when the evaluation signals DET[0]~DET[3] include at least one high-level evaluation signal and determines that no mounted resistor error has been generated when all the evaluation signals DET[0]~DET[3] are at a low level. After determining that a mounted resistor error has been generated, the control circuit 150 transmits a specific error signal to the MPU13. The level at external terminal SDO is basically high, except during the interval in which the display driver 10 sends a signal in response to an instruction from the MPU13. The control circuit 150 transmits the error signal to the MPU13 through the communication-oriented IF160 and by keeping the level at external terminal SDO low.

The error signal is further explained below. The display driver 10 not only detects a mounted resistor error but also detects whether any other errors have been generated. The other errors include a logical error indicative of an abnormality in a logical circuit in the display driver 10 and a checksum error indicative of an abnormality in a checksum pertaining to SPI communication. After detecting an error, the control circuit 150 stores its detection contents in the register RG.

For the sake of illustration, the description below is focused on a mounted resistor error, logical error and checksum error. A mounted resistor error flag, logical error flag and checksum error flag are stored in the register RG. After detecting a mounted resistor error, logical error and checksum error, the control circuit 150 substitutes "1" into each of the mounted resistor error flag, logical error flag and checksum error flag in the register RG and retains the "1" s. The initial values of the flags are "0".

After detecting at least one of the mounted resistor error, logical error and checksum error, the control circuit 150 does not distinguish between the errors thus generated but transmits the error signal to the MPU13 by keeping the level at external terminal SDO low. The MPU13 receives the error signal and thus acknowledges that the display driver 10 has detected an error, and in consequence the MPU 13 performs a specific warning procedure corresponding to the acknowledgement result. The warning procedure includes, for example, a procedure whereby the display panel 11 performs specific warning display and a process whereby a warning lamp (not shown) emits light. After receiving the error signal, the MPU13 can appropriately send to the display driver 10 a specific read instruction on access to the retained contents of the register RG. In response to the read instruction, the display driver 10 sends to the MPU13 the respective values of the mounted resistor error flag, logical error flag and checksum error flag stored in the register RG. Hence, the MPU13 can confirm which error has occurred.

Furthermore, upon determination that a mounted resistor error is generated, the control circuit 150 causes the register RG to store and retain detailed data about a pattern for identifying which of the evaluation signals DET[0]~DET[3] is at a high level. Under this condition, the control circuit 150 sends the detailed data retained in the register RG to the MPU13 in response to the receipt of the read instruction from the MPU13. For example, an administrator or manufacturer of the display driver 10 or the display device 1 can use the detailed data obtained from the MPU13 to troubleshoot the display driver 10 or the display device 1.

According to the present disclosure, the pattern of the error signal is not restricted to the aforesaid pattern. A dedicated external terminal (an external terminal for exclusive use with the mounted resistor error), which sends to the MPU13 the error signal related to the mounted resistor error, is disposed at the display driver 10.

According to this embodiment, the resistance value of a mounted resistor can be estimated. Upon detection of the mounted resistor error, the warning procedure or the like is performed to inform users of the necessity of repairing the display device 1 before the display of the display panel 11 fails.

Power consumption of the resistance value evaluation circuit 140a shown in FIG. 11 is minimized for two reasons as follows: DC voltage VDD is applied to the series-connected circuit SCa only within the evaluation interval; and, only within the evaluation interval does a current pass through the comparator 141 to enable the operation of the comparator 141. However, it is also feasible to apply DC voltage VDD to the series-connected circuit SCa all the time or dispense the circuit of FIG. 11 with transistor M9 and pass a current through the comparator 141 all the time.

Second Embodiment

The second embodiment of the present disclosure is described below. The second embodiment and subsequent third~sixth embodiments are based on the first embodiment. When it comes to technical features not specified in the second~sixth embodiments, the disclosure contained in the first embodiment shall be applicable to the second~sixth embodiments unless a contradiction arises as a result. All contradictions between the first and second embodiments must have priority over the disclosure contained in the second embodiment for the sake of interpretation of the disclosure contained in the second embodiment; this rule also applies to the third~sixth embodiments. The first~sixth embodiments can be combined unless there is a contradiction therebetween.

The constituent elements of the resistance value evaluation circuit 140[i] shall not be restricted to the depiction of FIG. 11, provided that the resistance value evaluation circuit 140[i] generates evaluation signal DET[i] corresponding to the sum of resistance values of mounted resistors RA[i], RB[i] (i.e., resistance value sum $R_{SUM}[i]$).

Figure 13:
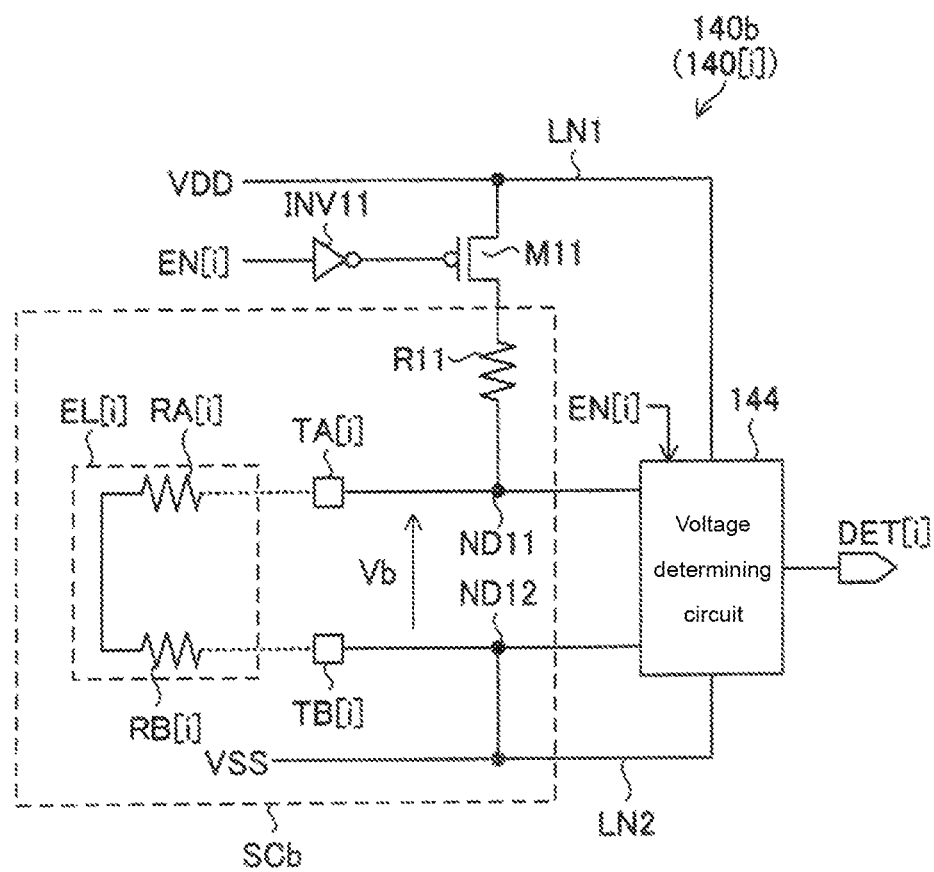
FIG. 13 is a circuit diagram of a resistance value evaluation circuit according to the second embodiment of the present disclosure.

For example, the resistance value evaluation circuit 140[i] is hereunder represented by the resistance value evaluation circuit 140b shown in FIG. 13. The resistance value evaluation circuit 140b comprises a transistor M11, resistor R11, inverter circuit INV11 and voltage-determining circuit 144. In the evaluation circuit 140b, positive-side power voltage VDD is applied to high-voltage side power line LN1, whereas negative-side power voltage VSS is applied to low-voltage side power line LN2. The power voltage VSS may also has an electric potential of 0 V. The specific positive DC voltage VDD is applied to power line LN1 when viewed from power line LN2. Transistor M11 is implemented as P-channel MOSFET.

In the evaluation circuit 140b, the source of transistor M11 connects to line LN1, the drain of transistor M11 connects to node ND11 by resistor R11, and node ND11 connects to evaluation-oriented bump TA[i], with node ND12 connected to evaluation-oriented bump TB[i] and connected to line LN2. The enabling signal EN[i] is inputted to the input end of inverter circuit INV11. The output end of the inverter circuit INV11 connects to the gate of transistor M11.

In the evaluation circuit 140b shown in FIG. 13, transistor M11 is on when the enabling signal EN[i] is at a high level, and thus DC voltage VDD is applied to a series-connected circuit SCb of resistor R11 (evaluation-oriented resistor), mounted resistor RA[i] formed between the evaluation-oriented bump TA[i] and evaluation-oriented electrodes EL[i], and mounted resistor RB[i] formed between the evaluation-oriented bump TB[i] and evaluation-oriented electrodes EL[i]. In the evaluation circuit 140b shown in FIG. 13, transistor M11 is off when the enabling signal EN[i] is at a low level, and thus DC voltage VDD is not applied to the series-connected circuit SCb. Therefore, voltage Vb corresponding to resistance value sum $R_{SUM}[i]$ is generated between node ND11 and ND12 only in the specific evaluation interval when the enabling signal EN[i] is at a high level. Therefore, resistance value sum $R_{SUM}[i]$ can be evaluated within the evaluation interval. Voltage Vb denotes the electric potential of node ND11 when viewed from the electric potential of node ND12.

The voltage-determining circuit 144 comprises a comparator or amplifier driven in accordance with power voltages VDD, VSS. In the evaluation interval when the enabling signal EN[i] is at a high level, a comparison of voltage Vb and specific threshold voltage $V_{TH}$ is performed, so as to not only generate and output high-level evaluation signal DET[i] when voltage Vb is greater than threshold voltage $V_{TH}$ but also generate and output low-level evaluation signal DET[i] when voltage Vb is lower than threshold voltage $V_{TH}$. In the event of "Vb=$V_{TH}$", evaluation signal DET[i] is either at a high level or at a low level. It is also feasible to stop the operation of the voltage-determining circuit 144 when the enabling signal EN[i] is at a low level.

In the evaluation circuit 140b, evaluation of resistance value of resistor R11 and voltage $V_{TH}$ is performed under the conditions as follows: evaluation signal DET[i] is at a high level within the evaluation interval when resistance value sum $R_{SUM}[i]$ is higher than a specific threshold resistance value $R_{TH}$, and evaluation signal DET[i] is at a low level within the evaluation interval when resistance value sum $R_{SUM}[i]$ is lower than a specific threshold resistance value $R_{TH}$.

Moreover, from the perspective of reduction of power consumption, it is sufficient to apply DC voltage VDD to the series-connected circuit SCb only within the evaluation interval and permit the voltage-determining circuit 144 to operate only within the evaluation interval. However, it is also feasible to apply DC voltage VDD to the series-connected circuit SCb all the time or permit the voltage-determining circuit 144 to operate all the time.

Figure 14:
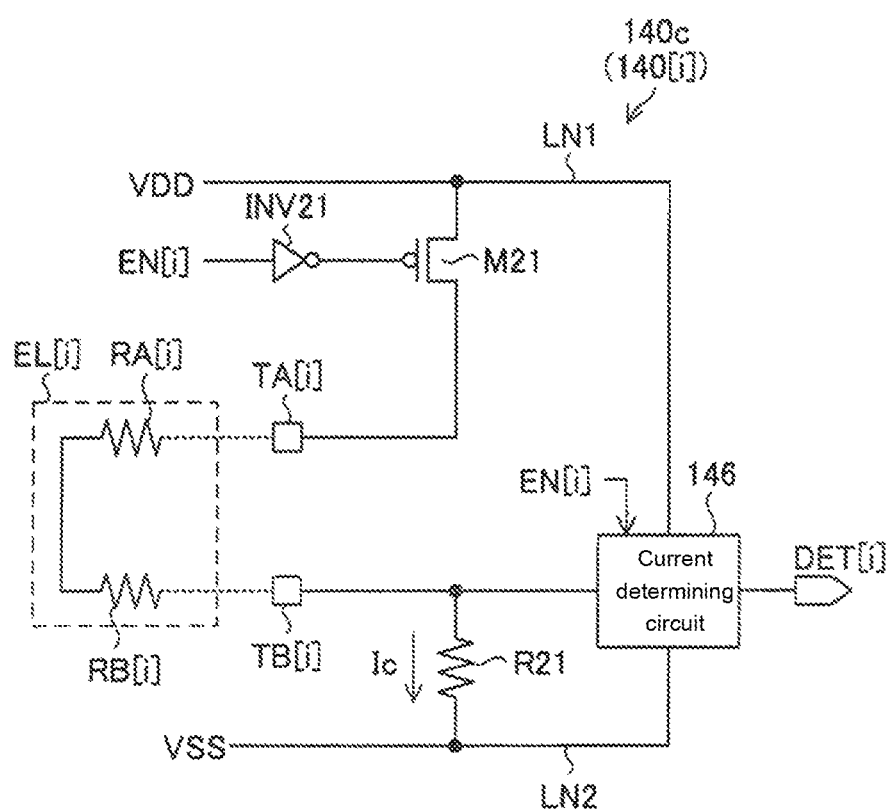
FIG. 14 is another circuit diagram of the resistance value evaluation circuit according to the second embodiment of the present disclosure.

Alternatively, for example, the resistance value evaluation circuit 140[$i$] is represented by the resistance value evaluation circuit 140$c$ shown in FIG. 14. The resistance value evaluation circuit 140$c$ comprises a transistor M21, sensing resistor R21, inverter circuit INV21 and current-determining circuit 146. In the evaluation circuit 140$c$, positive-side power voltage VDD is applied to high-voltage side power line LN1, whereas negative-side power voltage VSS is applied to low-voltage side power line LN2. The power voltage VSS may also has an electric potential of 0 V. The specific positive DC voltage VDD is applied to power line LN1 when viewed from power line LN2. Transistor M21 is implemented as P-channel MOSFET.

In the evaluation circuit 140$c$, the source of transistor M21 connects to line LN1, the drain of transistor M21 connects to evaluation-oriented bump TA[$i$], and evaluation-oriented bump TB[$i$] connects to line LN2 by sensing resistor R21. The enabling signal EN[$i$] is inputted to the input end of inverter circuit INV21. The output end of inverter circuit INV21 connects to the gate of transistor M21.

In the evaluation circuit 140$c$ shown in FIG. 14, transistor M21 is on when the enabling signal EN[$i$] is at a high level, and thus voltage is applied to between evaluation-oriented bumps TA[$i$], TB[$i$], and current Ic passes through evaluation-oriented bumps TA[$i$], TB[$i$] and sensing resistor R21. In the evaluation circuit 140$c$ shown in FIG. 14, transistor M21 is off when the enabling signal EN[$i$] is at a low level, and thus circulation of current Ic stops. In the specific evaluation interval when the enabling signal EN[$i$] is at a high level, the strength of current Ic depends on resistance value sum $R_{SUM}[i]$, thereby allowing resistance value sum $R_{SUM}[i]$ to be evaluated according to the strength of evaluation current Ic.

The current-determining circuit 146 comprises a comparator or amplifier driven in accordance with power voltages VDD, VSS. In the evaluation interval when the enabling signal EN[$i$] is at a high level, the strength of current Ic is measured according to the voltage drop which sensing resistor R21 undergoes. High-level evaluation signal DET[$i$] is generated and outputted when the strength of current Ic is smaller than a specific threshold current level $I_{TH}$. Low-level evaluation signal DET[$i$] is generated and outputted when the strength of current Ic is higher than a specific threshold current level $I_{TH}$. If the strength of current Ic is equal to the specific threshold current level $I_{TH}$, evaluation signal DET[$i$] will be either at a high level or at a low level. It is also feasible to stop the operation of the current-determining circuit 146 when the enabling signal EN[$i$] is at a low level.

In the evaluation circuit 140$c$, threshold current level $I_{TH}$ is set under the conditions as follows: evaluation signal DET[$i$] is at a high level within the evaluation interval when resistance value sum $R_{SUM}[i]$ is higher than a specific threshold resistance value $R_{TH}$; and evaluation signal DET[$i$] is at a low level within the evaluation interval when resistance value sum $R_{SUM}[i]$ is lower than a specific threshold resistance value $R_{TH}$. In the evaluation circuit 140$c$, the resistance value of sensing resistor R21 is sufficiently less than resistance value sum $R_{SUM}[i]$ (at the very least, the resistance value of sensing resistor R21 is sufficiently less than resistance value sum $R_{SUM}[i]$ when resistance value sum $R_{SUM}[i]$ is as great as threshold resistance value $R_{TH}$ as a result of years of deterioration.) Under this condition, within the evaluation interval, current Ic is substantially denoted by "Ic=VDD/$R_{SUM}[i]$".

Moreover, from the perspective of reduction of power consumption, it is sufficient for current Ic to circulate only within the evaluation interval and for the current-determining circuit 146 to operate only within the evaluation interval. However, it is also feasible for current Ic to circulate all the time or for the current-determining circuit 146 to operate all the time.

Third Embodiment

The third embodiment of the present disclosure is described below. The display device 1 is mounted on any apparatus, such as a TV set, cellular phone (including smartphone), information terminal, gaming apparatus, vehicle (for example, automobile), etc.

If the display device 1 is mounted on a vehicle (for example, automobile), for example, the display panel 11 can function as the dashboard in the vehicle. The dashboard in the vehicle displays the speed of the vehicle, the number of revolutions per unit time of an engine which the vehicle is equipped with, and the amount of fuel available to the engine. However, if the display function of the dashboard is abnormal, driving safety of the vehicle may be compromised. The display device 1 is capable of detecting for a mounted resistor error automatically; hence, a driver is informed of the abnormality of the display device 1 by a warning procedure before the onset of display abnormality related to the mounted resistor error or the exacerbation of display abnormality. Therefore, the driver is less likely to drive the vehicle in the presence of display abnormality of the dashboard.

Fourth Embodiment

The fourth embodiment of the present disclosure is described below. Although the preceding embodiments disclose a resistance value evaluation circuit 140 which operates in conjunction with a pair of evaluation-oriented bumps, it is also feasible that the number of the resistance value evaluation circuits 140 in the display driver 10 is less than the number of the pairs of evaluation-oriented bumps (this is also the case in the fifth embodiment below). For example, it is also feasible that only one resistance value evaluation circuit 140 is disposed in the display driver 10 to therefore perform evaluation successively with the single resistance value evaluation circuit 140 according to resistance value sums $R_{SUM}[0]$~$R_{SUM}[3]$ by time-division multiplexing and generate evaluation signals DET[0]~DET[3] successively with the single resistance value evaluation circuit 140. However, considering the course of wirings, it is relatively more advantageous to provide the resistance value evaluation circuit 140 operating in conjunction with a pair of evaluation-oriented bumps.

Fifth Embodiment

The fifth embodiment of the present disclosure is described below. The number of pairs of evaluation-oriented bumps and configuration thereof in the fifth embodiment are hereunder described in detail.

Although the preceding embodiments disclose that the display driver 10 is provided with four pairs of evaluation-oriented bumps CHK[0]~CHK[3], it is feasible for the display driver 10 to be provided with at least one pair of evaluation-oriented bumps.

The scenario in which only one pair of evaluation-oriented bumps are disposed on the display driver 10 is hereinafter referred to as JA. The one pair of evaluation-oriented bumps disposed on the display driver 10 in JA is hereinafter referred to as a pair of evaluation-oriented bumps CHK_A. If JA is applied to FIG. 4, bump pair CHK_A may also be located at any one of the positions of bump pairs CHK[0]~CHK[3] shown in FIG. 4 or at any position (for example, the position of origin O) on the connection surface P1. That the bump pair CHK_A is centrally disposed on the connection surface P1 is, for example, especially suitable for the connection surface P1 in a square or substantially square shape. In JA, the signal-oriented bumps which constitute the signal-oriented bump group are disposed at any positions on the connection surface P1 of the display driver 10. In JA, it is sufficient to provide the display driver 10 with one resistance value evaluation circuit 140.

The scenario in which two pairs of evaluation-oriented bumps are disposed on the display driver 10 is hereinafter referred to as JB. The two pairs of evaluation-oriented bumps disposed on the display driver 10, i.e., in JB, include a first pair of evaluation-oriented bumps CHK_B1 and a second pair of evaluation-oriented bumps CHK_B2. If JB is applied to FIG. 4, bump pairs CHK_B1 and CHK_B2 may also be located at the positions of bump pairs CHK[0], CHK[1] in FIG. 4, respectively, or at the positions of bump pair CHK[0], CHK[2] in FIG. 4, respectively.

Figure 15:
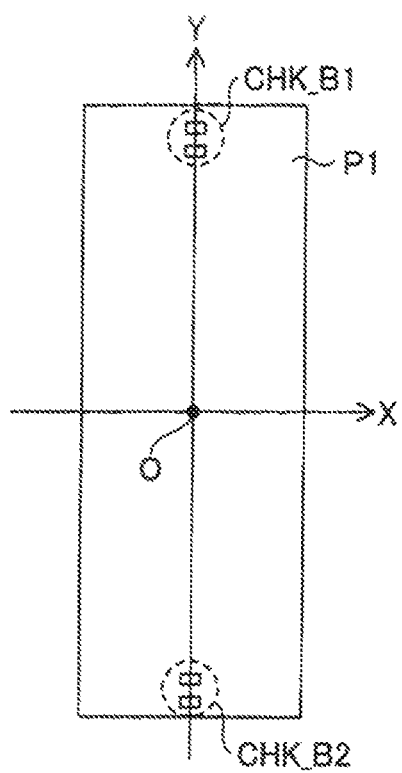
FIG. 15($a$), ($b$) are schematic views of two pairs of evaluation-oriented bumps according to the fifth embodiment of the present disclosure.
Figure 15:
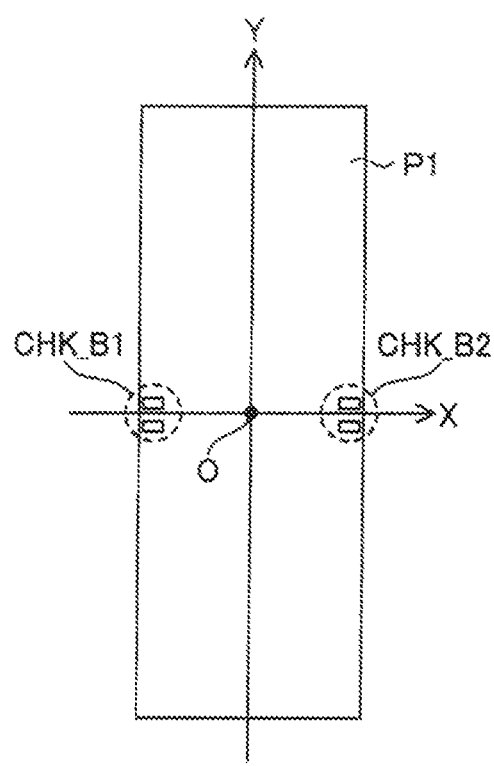

For example, as shown in FIG. 15(a), bump pairs CHK_B1 and CHK_B2 may be disposed on Y axis and spaced apart from each other. Under this condition, it is good enough for bump pair CHK_B1 and bump pair CHK_B2 to be symmetric to each other with respect to X axis. Likewise, for example, as shown in FIG. 15(b), bump pairs CHK_B1 and CHK_B2 may be disposed on X axis and spaced apart from each other. Under this condition, it is good enough for bump pair CHK_B1 and bump pair CHK_B2 to be symmetric to each other with respect to Y axis.

The scenario in which four pairs of evaluation-oriented bumps are disposed on the display driver 10 is hereinafter referred to as JC. The four pairs of evaluation-oriented bumps disposed on the display driver 10, i.e., in JC, include first~fourth pairs of evaluation-oriented bumps CHK_C1~CHK_C4. An embodiment which illustrates J4 clearly is equivalent to what is depicted in FIG. 4, but it renders the positions of bump pairs CHK_C1 CHK_C4 variable.

Figure 16:
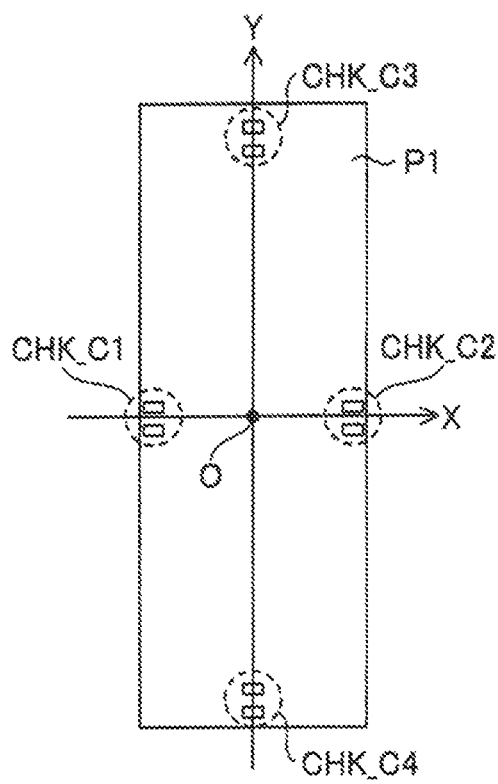
FIG. 16 is a schematic view of four pair of evaluation-oriented bumps according to the fifth embodiment of the present disclosure.

For example, as shown in FIG. 16, bump pairs CHK_C1 and CHK_C2 are disposed on X axis and spaced apart from each other, whereas bump pairs CHK_C3 and CHK_C4 are disposed on Y axis and spaced apart from each other. Under this condition, it is good enough for bump pair CHK_C1 and bump pair CHK_C2 to be symmetric to each other with respect to Y axis, and it is good enough for bump pair CHK_C3 and bump pair CHK_C4 to be symmetric to each other with respect to X axis line.

The pairs of evaluation-oriented bumps of the display driver 10 are in the number of three (not shown) or at least five (not shown). As mentioned above, evaluation-oriented electrodes are disposed on the mounting surface of the transparent substrate 12 and disposed opposite to each pair of evaluation-oriented bumps. After the COG mounting (i.e., in the standard state), as shown in FIG. 8, each pair of evaluation-oriented bumps are in contact with and electrically connect to the evaluation-oriented electrodes, respectively.

Furthermore, as shown in FIG. 4, two bump rows are disposed on the connection surface P1 of the display driver 10, but the fifth embodiment of the present disclosure is not restrictive of the pattern of arrangement of the bumps disposed on the connection surface P1 of the display driver 10. According to the present disclosure, it is feasible that, for example, one bump row or at least three bump rows are disposed on the connection surface P1.

To evaluate the mounted resistor for the signal-oriented bumps and provide at least two pairs of evaluation-oriented bumps, for example, the first and second pairs of evaluation-oriented bumps, on the connection surface P1 of the display driver 10, it is sufficient to provide at least one signal-oriented bump which constitutes the signal-oriented bump group between the first pair of evaluation-oriented bumps and the second pair of evaluation-oriented bumps.

To evaluate the mounted resistor for the signal-oriented bumps and provide at least four pairs of evaluation-oriented bumps, for example, the first fourth pairs of evaluation-oriented bumps, on the connection surface P1 of the display driver 10, it is sufficient to provide at least one signal-oriented bump which constitutes the signal-oriented bump group on or inside a rectangle formed by joining the first-~fourth locations of the first~fourth pairs of evaluation-oriented bumps.

Figure 17:
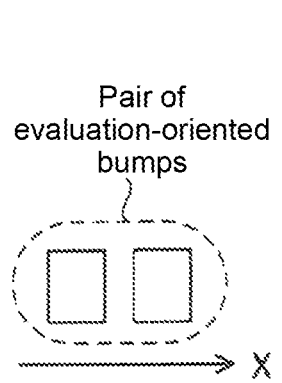
FIGS. 17($a$)~($c$) are schematic views of arrangement of two evaluation-oriented bumps which form one pair of evaluation-oriented bumps according to the fifth embodiment of the present disclosure.
Figure 17:
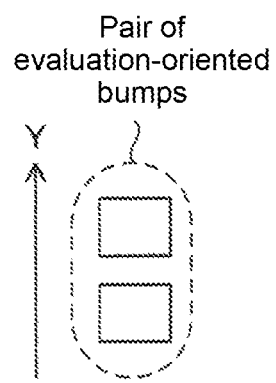
Figure 17:
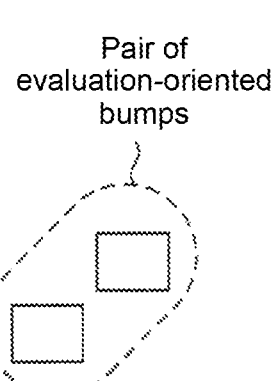

Furthermore, any pair of evaluation-oriented bumps disposed on the connection surface P1 of the display driver 10 and two evaluation-oriented bumps which constitute a pair of evaluation-oriented bumps are aligned along a direction, such as X axis direction shown in FIG. 17(a), Y axis direction shown in FIG. 17(b), or any direction other than X axis and Y axis directions shown in FIG. 17(c). As shown in FIG. 16, the two evaluation-oriented bumps of each pair of evaluation-oriented bumps can be aligned along the same direction as Y axis direction, for example, both a direction which two evaluation-oriented bumps forming bump pair CHK_C1 are aligned along and a direction which two evaluation-oriented bumps forming bump pair CHK_C2 are aligned along are set to Y axis direction, whereas both a direction which two evaluation-oriented bumps forming bump pair CHK_C3 are aligned along and a direction which two evaluation-oriented bumps forming bump pair CHK_C4 are aligned along are set to X axis direction.

Figure 18:
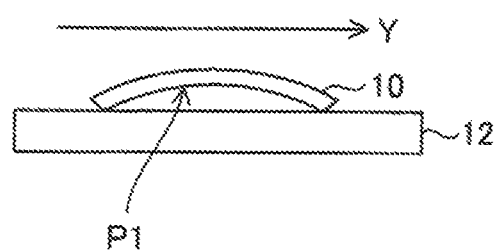
FIG. 18 is a schematic view which shows that an IC chip of the display driver bends according to the fifth embodiment of the present disclosure.

An IC chip functioning as the display driver 10 is mounted on the transparent substrate 12 by COG mounting; then, they are heated and laminated together. After the lamination, if the temperature of the display driver 10 and the transparent substrate 12 drops, as shown in FIG. 18, the connection surface P1 of the display driver 10 will bend relative to the mounting surface of the transparent substrate 12 (the bend shown in FIG. 18 is exaggerated) because of a difference in coefficient of thermal expansion between the display driver 10 and the transparent substrate 12. The bend is a factor in an increase of the resistance value of the mounted resistor. The extent of the bend is expected to top out in the vicinity of X axis. Therefore, as shown in FIG. 15(b) or FIG. 16, a pair of evaluation-oriented bumps are disposed on X axis (or in the vicinity of X axis) in advance such that the mounted resistor for the pair of evaluation-oriented bumps can be evaluated.

Sixth Embodiment

The sixth embodiment of the present disclosure is described below. The sixth embodiment discloses variant technology or applied technology applicable to any one of the first~fifth embodiments.

The shape (as projected on XY-plane) of the IC chip functioning as the display driver 10 is mainly rectangular, but the sixth embodiment of the present disclosure is not limited thereto.

The preceding embodiments of the present disclosure disclose the display device 1 with the display panel 11 implemented as a liquid crystal panel. However, it is also feasible for the present disclosure to provide a display device whose display panel is not liquid crystal panel. For example, the present disclosure is applicable to a display device whose display panel is organic EL (electroluminescence) panel or PDP (plasma display panel).

The application of the evaluation method of the mounted resistor of the present disclosure is not restricted to a display driver, as the present disclosure is widely applicable to any purpose of evaluation of a mounted resistor.

The present disclosure, which is exemplified by a display driver, provides a semiconductor device. Bumps disposed on a connection surface of the semiconductor device electrically connect to electrodes disposed on an object substrate, and thus the semiconductor device is mounted on the object substrate. The object substrate is exemplified by the transparent substrate 12. The mounting is performed by COG mounting; however, the mounting is not restricted to COG mounting but includes, for example, COF (chip-on-film) mounting. Under this condition, the semiconductor device is mounted, by COF mounting, on a flexible substrate functioning as an object substrate.

The high-level state and low-level state of any signal or voltage is swappable without jeopardizing the aforesaid objective. Furthermore, the channel type of FET is subject to changes without jeopardizing the aforesaid objective.

The transistors may also be any type of transistors. For example, the aforesaid MOSFET may be replaced by junction FET, IGBT (insulated-gate bipolar transistor) or bipolar transistor. Any transistor has a first terminal, second terminal and control terminal. In FET, one of the first and second terminals is drain, the other is source, and the control terminal is gate. In IGBT, one of the first and second terminals is collector, the other is emitter, and the control terminal is gate. In the bipolar transistor (i.e., not IGBT), one of the first and second terminals is collector, the other is emitter, and the control terminal is base.

DESCRIPTION OF THE PRESENT DISCLOSURE

Embodiments of the present disclosure are described below.

A semiconductor device W disclosed in an aspect of the present disclosure has the connection surface (P1) which a signal-oriented bump group is formed on and is capable of sending signals to an object substrate through a signal-oriented electrode group on the object substrate, the signal-oriented bump group and the object substrate (12) disposed opposite to the connection surface. The semiconductor device W comprises: a pair of evaluation-oriented bumps (CHK[i]) comprising a first evaluation-oriented bump (TA[i]) and a second evaluation-oriented bump (TB[i]) which are disposed on the connection surface differently from the signal-oriented bump group and spaced apart from each other; and a resistance value evaluation circuit (140[i]); wherein an evaluation-oriented electrodes (EL[i]) on the object substrate are in contact with the pair of evaluation-oriented bumps in a standard state where the object substrate is disposed opposite to the connection surface and the signal-oriented electrode group electrically connects to the signal-oriented bump group, wherein the resistance value evaluation circuit generates an evaluation signal (DET[i]) corresponding to a resistance value between the first evaluation-oriented bump and the second evaluation-oriented bump through the evaluation-oriented electrode in the standard state.

From the perspective of circuit scale and power consumption, it is unrealistic to test, one by one, mounted resistors formed between the signal-oriented bumps and signal-oriented electrodes. The semiconductor device W estimates resistance value of a mounted resistor formed between each evaluation-oriented bump and evaluation-oriented electrodes in accordance with an evaluation signal and even identifies the mounted resistors formed between the signal-oriented bumps and signal-oriented electrodes. The technical requirements disclosed in the present disclosure to obtain the evaluation signal are simple and small-scale. Therefore, the semiconductor device W is capable of evaluating the mounted resistors by meeting the simple, small-scale technical requirements.

Specifically speaking, for example, regarding the semiconductor device W, the objective of the present disclosure can be achieved, provided that the resistance value evaluation circuit in the standard state generates the evaluation signal according to the sum ($R_{SUM}$[i]) of the resistance value of the first mounted resistor (RA[i]) formed between the first evaluation-oriented bump and the evaluation-oriented electrodes and the resistance value of the second mounted resistor (RB[i]) formed between the second evaluation-oriented bump and the evaluation-oriented electrodes.

Specifically speaking, for example, regarding the semiconductor device W, the resistance value evaluation circuits (140[i], 140a, 140b; see FIG. 11 and FIG. 13) generate the evaluation signal in accordance with voltages (Va, Vb) generated between the first evaluation-oriented bump and the second evaluation-oriented bump when specific DC voltage (VDD) is applied to the series-connected circuits (SCa, SCb) of the first evaluation-oriented bump and the second evaluation-oriented bump which are connected by the evaluation-oriented electrodes and at least one evaluation-oriented resistor.

Alternatively, for example, regarding the semiconductor device W, the resistance value evaluation circuit (140[i], 140c; see FIG. 14) generates the evaluation signal according to the current (Ic) flowing between the first evaluation-oriented bump and the second evaluation-oriented bump when voltage is applied to between the first evaluation-oriented bump and the second evaluation-oriented bump.

Various changes may be appropriately made to embodiments of the present disclosure without departing from the technical concepts embodied in the claims of the present disclosure. The embodiments merely serve illustrative purposes. The present disclosure and definitions of constituent elements disclosed in the present disclosure are not restricted to the embodiments. Specific numeric values disclosed in the present disclosure merely serve exemplary purposes and thus are subject to changes.

What is claimed is:

1. A semiconductor device, having a connection surface which a signal-oriented bump group is formed on, allowing signals to be sent to an object substrate through a signal-oriented electrode group on the object substrate and the signal-oriented bump group and the object substrate disposed opposite to the connection surface, the semiconductor device comprising:

a pair of evaluation-oriented bumps comprising a first evaluation-oriented bump and a second evaluation-oriented bump which are disposed on the connection surface differently from the signal-oriented bump group and spaced apart from each other; and a resistance value evaluation circuit;

wherein an evaluation-oriented electrode on the object substrate are in contact with the pair of evaluation-oriented bumps in a standard state where the object substrate is disposed opposite to the connection surface and the signal-oriented electrode group electrically connects to the signal-oriented bump group, wherein the resistance value evaluation circuit generates an evaluation signal corresponding to a resistance value between the first evaluation-oriented bump and the second evaluation-oriented bump through the evaluation-oriented electrode in the standard state.

2. The semiconductor device of claim 1, wherein
the resistance value evaluation circuit generates the evaluation signal in accordance with the sum of a resistance value generated by a first mounted resistor and a resistance value generated by a second mounted resistor in the standard state, the first mounted resistor formed between the first evaluation-oriented bump and the evaluation-oriented electrodes and the second mounted resistor formed between the second evaluation-oriented bump and the evaluation-oriented electrodes.

3. The semiconductor device of claim 2, wherein
the resistance value evaluation circuit generates the evaluation signal having a first logical value when the sum of the resistance values is relatively low and generates the evaluation signal having a second logical value when the sum of the resistance values is relatively high.

4. The semiconductor device of claim 3, wherein
after generating the evaluation signal having the second logical value, the semiconductor device sends a specific erroneous signal outward.

5. The semiconductor device of claim 1, wherein
the resistance value evaluation circuit generates the evaluation signal in accordance with a voltage generated between the first evaluation-oriented bump and the second evaluation-oriented bump when a specific DC voltage is applied to a series-connected circuit of the first evaluation-oriented bumps, second evaluation-oriented bumps and at least one evaluation-oriented resistor which are connected by the evaluation-oriented electrodes.

6. The semiconductor device of claim 5, wherein
the resistance value evaluation circuit comprises a first evaluation-oriented resistor with an end connected to the first evaluation-oriented bump and a second evaluation-oriented resistor with an end connected to the second evaluation-oriented bump, and the resistance value evaluation circuit generates the evaluation signal in accordance with a voltage generated between the first evaluation-oriented bump and the second evaluation-oriented bump when the DC voltage is applied to between another end of the first evaluation-oriented resistor and another end of the second evaluation-oriented resistor.

7. The semiconductor device of claim 1, wherein
the resistance value evaluation circuit generates the evaluation signal according to a current flowing between the first evaluation-oriented bump and the second evaluation-oriented bump when a voltage is applied to between the first evaluation-oriented bump and the second evaluation-oriented bump.

8. The semiconductor device of claim 1, wherein
a plurality of pairs of evaluation-oriented bumps are provided as the pair of evaluation-oriented bumps, in the standard state, a plurality of the evaluation-oriented electrodes on the object substrate are in contact with the plurality of pairs of evaluation-oriented bumps respectively, and the resistance value evaluation circuit generates the evaluation signal to each group of the evaluation-oriented electrodes and the pair of evaluation-oriented bumps which contact to each other in the standard state.

9. The semiconductor device of claim 8, wherein
a plurality of resistance value evaluation circuits is provided as the resistance value evaluation circuit, one resistance value evaluation circuit is assigned to each pair of evaluation-oriented bumps, and the resistance value evaluation circuits each generate the evaluation signal related to the corresponding pair of evaluation-oriented bumps.

10. The semiconductor device of claim 8, wherein
the plurality of pairs of evaluation-oriented bumps comprises a first pair of evaluation-oriented bumps and a second pair of evaluation-oriented bumps, and at least one signal-oriented bump which forms the signal-oriented bump group is disposed on the connection surface and between the first pair of evaluation-oriented bumps and the second pair of evaluation-oriented bumps.

11. The semiconductor device of claim 8, wherein
the plurality of pairs of evaluation-oriented bumps comprises a first pair of evaluation-oriented bumps to a fourth pair of evaluation-oriented bumps which are disposed at a first position to a fourth position on the connection surface, and at least one signal-oriented bump which forms the signal-oriented bump group is disposed on the connection surface and positioned on or within a rectangle formed by connecting the first position to the fourth position.

12. A display driver, driving a display panel formed in a transparent substrate and using the semiconductor device of claim 1, the object substrate is the transparent substrate, and the display driver sends signals for specifying display contents in the display panel through the signal-oriented bump group and the signal-oriented electrode group on the transparent substrate in the standard state.

13. A display device, comprising:
the display driver of claim 12; and the transparent substrate which the display panel is formed.

* * * * *